United States Patent
Ogawa et al.

(10) Patent No.: US 9,802,390 B2
(45) Date of Patent: Oct. 31, 2017

(54) LAMINTED GLASS ASSEMBLY

(71) Applicants: NIPPON SHEET GLASS CO., LTD., Tokyo (JP); PILKINGTON GROUP LIMITED, Lathom (GB)

(72) Inventors: Hisashi Ogawa, Sagamihara (JP); Hisashi Asaoka, Sagamihara (JP); Mark A. Chamberlain, Lathom (GB)

(73) Assignees: Nippon Sheet Glass Co., Ltd., Tokyo (JP); Pilkington Group Limited, Lathom (GB)

( * ) Notice: Subject to any disclaimer, the term of this patent is extended or adjusted under 35 U.S.C. 154(b) by 227 days.

(21) Appl. No.: 14/392,060

(22) PCT Filed: Oct. 30, 2013

(86) PCT No.: PCT/JP2013/006445
§ 371 (c)(1),
(2) Date: Jul. 20, 2015

(87) PCT Pub. No.: WO2014/122704
PCT Pub. Date: Aug. 14, 2014

(65) Prior Publication Data
US 2015/0343744 A1    Dec. 3, 2015

(30) Foreign Application Priority Data

Feb. 5, 2013  (JP) .................................. 2013-020071

(51) Int. Cl.
*B32B 17/10* (2006.01)
*B32B 3/26* (2006.01)
(Continued)

(52) U.S. Cl.
CPC ........ *B32B 17/10385* (2013.01); *B32B 3/266* (2013.01); *B32B 17/10036* (2013.01);
(Continued)

(58) Field of Classification Search
CPC combination set(s) only.
See application file for complete search history.

(56) References Cited

U.S. PATENT DOCUMENTS 3,076,727 A * 2/1963 Harwig ................... C03C 17/36
427/404
4,321,296 A    3/1982 Rougier
(Continued)

FOREIGN PATENT DOCUMENTS

| EP | 0267331 A1 | 5/1988 |
| EP | 0385791 A1 | 9/1990 |

(Continued)

*Primary Examiner* — Anne M Antonucci
*Assistant Examiner* — Renee LaRose
(74) *Attorney, Agent, or Firm* — Marshall & Melhorn, LLC

(57) ABSTRACT

Cracking of a laminated glass assembly having a device encapsulated therein during the manufacturing process is prevented. The laminated glass assembly includes a first and a second glass sheet; a first, a second and a third intermediate film interposed between the first and second glass sheets, in that order; an organic EL panel interposed between the first and second intermediate films and provided with a terminal member; and a first wiring member consisting of a metallic thin strip connected to the terminal member in a thickness-wise direction via a first solder; wherein at least one of the two glass sheets has a thickness of 1.0 mm to 1.6 mm; and at a connecting portion of the terminal member, the first solder and the first wiring member, the first wiring member has a thickness of 0.05 mm to 0.10 mm and a width of 3 mm to 15 mm, and the first solder has a thickness of 0.01 mm to 0.20 mm; and a total thickness of the terminal member, the first solder and the first wiring member is 0.16 mm to 0.40 mm.

15 Claims, 11 Drawing Sheets

(51) Int. Cl.
  *H05B 3/84* (2006.01)
  *H05B 3/06* (2006.01)
  *H01L 51/52* (2006.01)

(52) U.S. Cl.
  CPC .. *B32B 17/10293* (2013.01); *B32B 17/10467* (2013.01); *B32B 17/10541* (2013.01); *B32B 17/10651* (2013.01); *B32B 17/10761* (2013.01); *H05B 3/06* (2013.01); *H05B 3/84* (2013.01); *B32B 2457/12* (2013.01); *B32B 2457/20* (2013.01); *B32B 2457/202* (2013.01); *B32B 2457/206* (2013.01); *H01L 51/5203* (2013.01)

(56) References Cited

U.S. PATENT DOCUMENTS

| | | | | |
|---|---|---|---|---|
| 4,645,970 | A * | 2/1987 | Murphy | B32B 17/10036 313/509 |
| 5,070,230 | A * | 12/1991 | Osada | B32B 17/10036 219/203 |
| 5,208,444 | A * | 5/1993 | Winter | B32B 17/10036 219/203 |
| 5,414,240 | A * | 5/1995 | Carter | B32B 17/10036 219/203 |
| 5,886,321 | A * | 3/1999 | Pinchok, Jr. | B32B 17/10036 219/203 |
| 6,185,812 | B1 * | 2/2001 | Castle | B32B 17/10036 29/611 |
| 6,396,026 | B2 * | 5/2002 | Gillner | B32B 17/10036 219/202 |
| 6,410,120 | B1 * | 6/2002 | Frost | B32B 17/10036 428/174 |
| 7,202,410 | B2 | 4/2007 | Umemoto et al. | |
| 7,423,239 | B2 * | 9/2008 | Mann | B32B 17/10045 219/203 |
| 7,520,416 | B2 | 4/2009 | Crumbach et al. | |
| 8,481,857 | B2 * | 7/2013 | Reul | B32B 17/10036 174/117 A |
| 8,664,570 | B2 * | 3/2014 | Odeh | H05B 3/84 219/203 |
| 2002/0005398 | A1 * | 1/2002 | Gillner | B32B 17/10036 219/203 |
| 2004/0065651 | A1 * | 4/2004 | Voeltzel | B32B 17/10036 219/203 |
| 2004/0159645 | A1 * | 8/2004 | Gillner | B32B 17/10036 219/203 |
| 2009/0166347 | A1 * | 7/2009 | Blanchard | B32B 17/10036 219/201 |
| 2009/0277671 | A1 | 11/2009 | Hahn | |
| 2010/0215952 | A1 * | 8/2010 | Takamatsu | B32B 17/10 428/339 |
| 2010/0224235 | A1 | 9/2010 | Takagi et al. | |
| 2012/0152930 | A1 * | 6/2012 | Chamberlain | H05B 3/84 219/203 |

FOREIGN PATENT DOCUMENTS

| | | |
|---|---|---|
| EP | 1688284 A2 | 8/2006 |
| EP | 2025509 A1 | 2/2009 |
| JP | 08-43863 A | 2/1996 |
| JP | 10-253995 A | 9/1998 |
| JP | 11-26911 A | 1/1999 |
| JP | 2001-048602 A | 2/2001 |
| JP | 2002-319694 A | 10/2002 |
| JP | 2005-078992 A | 3/2005 |
| JP | 2006-503788 A | 2/2006 |
| JP | 2007-326763 A | 12/2007 |
| JP | 2010-500703 A | 1/2010 |
| WO | 2007122426 A1 | 11/2007 |
| WO | 2008047164 A1 | 4/2008 |

* cited by examiner

LAMINTED GLASS ASSEMBLY

TECHNICAL FIELD

The present invention relates to a laminated glass assembly having a device encapsulated between a pair of glass sheets.

BACKGROUND ART

Laminated glass assemblies having a device encapsulated between a pair of glass sheets is known. The device may consist of a display device such as an organic EL (electroluminescence) sheet, an inorganic EL sheet, a liquid crystal film and an LED array in a sheet form, solar cell modules and a variable light transmission sheet (such a as a suspended particle device sheet). See Patent Document 1, for instance. An assembly having an organic EL sheet encapsulated between a pair of glass sheets may function not only as a display device but also as an illuminating device having a variable brightness. An assembly having solar cell modules interposed between a pair of glass sheets may be fitted into an opening of a structure or a vehicle to be used as a power generating device. See Patent Document 2. Such assemblies may be used in motor vehicles, watercraft, aircraft and building in the forms of flat glass panels and curved glass panels. The device in such an assembly is connected to an external device via wires having ends interposed between the two glass sheets. It is also known to interpose electric heat wires between two glass sheets. See Patent Document 3. In such a laminated glass assembly, the fogging of the glass surface can be avoided by supplying electric power to the electric heat wires. The terminal ends of the heat wires are drawn from between the two glass sheets, and connected to the corresponding terminals of an external power source.

PRIOR ART REFERENCE(S)

Patent Document(S)

Patent Document 1: JP2005-078992A
Patent Document 2: JP2002-319694A
Patent Document 3: JP2010-500703A

SUMMARY OF THE INVENTION

Task to be Accomplished by the Invention

A laminated glass assembly of this type can be formed by performing a preliminary pressing step consisting of interposing a device, wiring and an intermediate layer between a pair of glass sheets, and pressing them together by using a vacuum bag or nip rollers, and a pressing and heating step using an autoclave. However, it is known that the glass sheets are prone to cracking in the preliminary pressing step and the pressing and heating step due to the presence of the device and the wiring between the two glass sheets. This problem becomes more prominent as the thickness of the glass sheets is decreased, particularly when the thickness of the glass sheets is less than 1.6 mm.

The cracking of the glass sheets can be avoided by positioning the connecting portions of the wiring for the device outside of the glass sheets as is the case with the laminated glass assembly disclosed in Patent Document 3. In the laminated glass assembly disclosed in Patent Document 3, a cutout is formed on an edge of one of the glass sheets to expose the surface of the other glass sheet, and to position the terminal ends of the lead wires of the device on the exposed surface. However, according to this approach, the connecting portions of the wires for the device are required to be drawn out of the two glass sheets so that the connecting structure becomes complex and the connecting work becomes laborious particularly when there are a large number of connections to be made. When the cutout is small, the work involved in making connections at the connecting portions becomes difficult. When the cutout is large, not only the external appearance but also the durability of the laminated glass assembly may be impaired.

The present invention was made in view of such problems of the prior art, and has a primary object to minimize the possibility of cracking the glass sheets in manufacturing a laminated glass assembly encapsulating a device therein without complicating the connecting structure and the connecting work.

Means to Accomplish the Task

To achieve such an object, the present invention provides a laminated glass assembly, comprising: a pair of glass sheets (103, 104); an intermediate film (106) interposed between the two glass sheets; an electric heat wire (101) extending along the intermediate film to emit heat when an electric current is supplied thereto; and a first electroconductive member (111) layered and connected to the electric heat wire in a thickness-wise direction of the glass sheets between the two glass sheets to supply electric power to the electric heat wire; wherein the two glass sheets are each made of soda-lime glass, and at least one of the two glass sheets has a thickness of 1.0 mm to 1.6 mm; the intermediate film has a thickness of 0.3 mm to 2.0 mm; and a connecting portion between the electric heat wire and the first electroconductive member has a thickness of 0.16 mm to 0.40 mm.

In this arrangement, because the connecting portion between the electric heat wire and the first electroconductive member is positioned between the two glass sheets, the connecting portion is not exposed outside of the two glass sheets, and may have a simple structure. This is particularly beneficial when there are a plurality of electric heat wires, and a plurality of connecting portions are provided between the electric heat wires and the first electroconductive member. Also, because the connecting portion between the electric heat wire and the first electroconductive member is interposed between the two glass sheets which are bonded to each other via the intermediate film, the connecting portion is formed by a highly stable connecting structure so that a failure in the connection can be avoided.

By selecting the thickness of the connecting portion between the electric heat wire and the first electroconductive member to be 0.16 mm to 0.40 mm, the cracking of the glass sheets during the preliminary pressing process using a vacuum press or nip rolls for manufacturing the laminated glass assembly can be avoided while ensuring an adequately low electric resistance. According to the investigation conducted by the inventors on the cause of cracks that occurred during the preliminary pressing process using a vacuum press or nip rolls for manufacturing the laminated glass assembly, it was discovered that the connecting portion often coincided with the starting point of the cracks, and that the cracks can be avoided by selecting the thickness of the connecting portion to be within the aforementioned range.

Preferably, one of the glass sheets and the intermediate film are provided with a cutout (129) on an edge portion thereof extending through a thickness thereof so that the other of the glass sheets defines a support surface (121) exposed in the cutout, and the laminated glass assembly further comprises a second electroconductive member (112) having an end connected to the first electroconductive member and another end configured to receive a supply of electric power from an external source.

In this arrangement, because the cutout is formed, and the second electroconductive member extends from the first electroconductive member to the cutout, the connecting wire for supplying electric power from an external source to the first electroconductive member may be connected to the second electroconductive member so that the connecting structure can be simplified.

In an embodiment of the present invention, the first electroconductive member extends along each of a pair of opposing sides of the laminated glass assembly, and the electric heat wire extends between the two first electroconductive members so as to connect the two first electroconductive members to each other.

In this arrangement, the electric heat wire may extend linearly so that the layout of the electric heat wire is simplified, and the possibility of breakage that could be caused by a bend in the electric heat wire can be minimized.

According to another aspect of the present invention, the laminated glass assembly (1) comprises a first and a second glass sheet (3, 4); a first, a second and a third intermediate film (6, 7, 8) interposed between the first and second glass sheets, in that order from the side of the first glass sheet; a device (2) interposed between the first and second intermediate films and provided with a terminal member (13); and a first wiring member (18) consisting of a metallic thin strip connected to the terminal member in a thickness-wise direction via a first solder (21) and interposed between the first and second intermediate films; wherein the first and second glass sheets are each made of soda-lime glass, and at least one of the two glass sheets has a thickness of 1.0 mm to 1.6 mm; at a connecting portion of the terminal member, the first solder and the first wiring member, the first wiring member has a thickness of 0.05 mm to 0.10 mm and a width of 3 mm to 15 mm, and the first solder has a thickness of 0.01 mm to 0.20 mm; and at the connecting portion, a total thickness of the terminal member, the first solder and the first wiring member is 0.16 mm to 0.40 mm.

In this arrangement, occurrence of cracks can be avoided in the manufacturing process of a laminated glass assembly having a device and wiring interposed between glass sheets along with an intermediate film. According to the investigation conducted by the inventors on the cause of cracks that occurred during the preliminary pressing process using a vacuum press or nip rolls for manufacturing the laminated glass assembly, it was discovered that the connecting portion formed between the terminal member and the first wiring member via the solder often coincided with the starting point of the cracks. Normally, the first wiring member is given with a small width, but is required to have a certain thickness to ensure an adequately low electric resistance so that a large change in thickness (a sharp projection) tends to be created. In particular, a solder is deposited on the connecting portion between the first wiring member and the terminal member, and this causes a significant change in thickness. Therefore, a concentration of stress tends to occur at the part of the glass sheets corresponding to the connecting portion between the terminal member and the first wiring member intervened by the solder. Therefore, by selecting the thickness of the connecting portion between the terminal member and the first wiring member intervened by the solder and the width of the first wiring member as discussed above, the change in thickness at the connecting portion can be reduced, and hence the concentration of stress in the glass sheets can be minimized. Thereby, the cracks of the glass sheets can be avoided.

In this aspect of the present invention, preferably, at the connecting portion of the terminal member, the first solder and the first wiring member, a ratio of a total thickness of the terminal member, the first solder and the first wiring member to the width of the first wiring member is 6.6% or less.

Thereby, the change in thickness at the connecting portion of the terminal member, the first solder and the first wiring member can be minimized, and the concentration of stress at the connecting portion can be minimized.

In this aspect of the present invention, preferably, the first wiring member comprises a plurality of metallic thin strips laminated one over another in an offset relationship such that one of the metallic thin strips protrudes from an end portion of the first wiring member, and the first solder is deposited on a protruding end of the one metallic thin strip.

In this arrangement, the part of the first wiring member on which the first solder is deposited is provided with a small thickness while the remaining part is provided with a large cross sectional area so that the first wiring member may be given with an adequately small resistance.

In this aspect of the present invention, preferably, the laminated glass assembly further comprises a second wiring member (19) consisting of a metallic thin strip connected to an end of the first wiring member opposite from the end on which the first solder is deposited, via a second solder (22); wherein, at a connecting portion of the first wiring member, the second solder and the second wiring member, the first wiring member has a thickness of 0.05 mm to 0.10 mm and a width of 3 mm to 15 mm, the second solder has a thickness of 0.01 mm to 0.20 mm, and a total thickness of the first wiring member, the second solder and the second wiring member is 0.16 mm to 0.40 mm.

In this arrangement, because the connecting portion of the first wiring member, the second solder and the second wiring member may have a relatively large thickness, by selecting the thickness of the connecting portion to be within the aforementioned range, the localized stress that the connecting portion may apply to the glass sheets can be minimized.

In this aspect of the present invention, preferably, at the connecting portion of the first wiring member, the second solder and the second wiring member, a ratio of a total thickness of the first wiring member, the second solder and the second wiring member to the width of the second wiring member is 6.6% or less.

In this arrangement, the change in thickness at the connecting portion of the first wiring member, the second solder and the second wiring member can be minimized so that the localized load that the connecting portion may apply to the glass sheets can be minimized.

In this aspect of the present invention, preferably, the terminal member includes a thin strip projecting from a side edge of the device, and the first, second and third intermediate films each have a thickness of 0.3 mm to 1.0 mm.

In this aspect of the present invention, preferably, the second intermediate film is provided with an opening (25) passed through a thickness thereof and having a shape corresponding to that of the device such that the device is received in the opening.

In this arrangement, the device is received in the opening so that the device is prevented from applying stress to the first and second glass sheets.

In this aspect of the present invention, the second intermediate film may be provided with a controlled visible light transmissivity so that the terminal member and the wiring members are invisible from the side of the second glass sheet.

In this arrangement, because the second intermediate film makes not only the device but also the wiring members invisible from the side of the second glass sheet, the external (esthetic) appearance of the laminated glass assembly improves.

In this aspect of the present invention, the first intermediate film may be provided with a controlled visible light transmissivity so that the device, the terminal member and the wiring members are invisible from the side of the first glass sheet.

In this arrangement, because the first intermediate film conceals the back side of the terminal member and the wiring members from view the side of the first glass sheet, the external (esthetic) appearance of the laminated glass assembly improves.

In this aspect of the present invention, the first, second and third intermediate films may each contain at least a member of a group consisting of polyvinyl acetal resin, ethylene-vinyl acetate resin, polyvinyl butyral resin and polyurethane resin. Polyvinyl acetal resin may include polyvinyl butyral (PVB), and ethylene-vinyl acetate may include ethylene-vinyl acetate copolymer (EVA).

Effect of the Invention

According to the structure discussed above, the possibility of cracking the glass sheets can be minimized in manufacturing a laminated glass assembly encapsulating a device therein without complicating the connecting structure and the connecting work.

DESCRIPTION OF THE PREFERRED EMBODIMENT(S)

Preferred embodiments of the present invention are described in the following with reference to the appended drawings. The laminated glass assembly 1 of the illustrated embodiments are internally provided with an organic EL panel 2 encapsulated therein, and can be used as windows and roof glazing for motor vehicles, aircraft, watercraft, buildings and so on.

Figure 1:
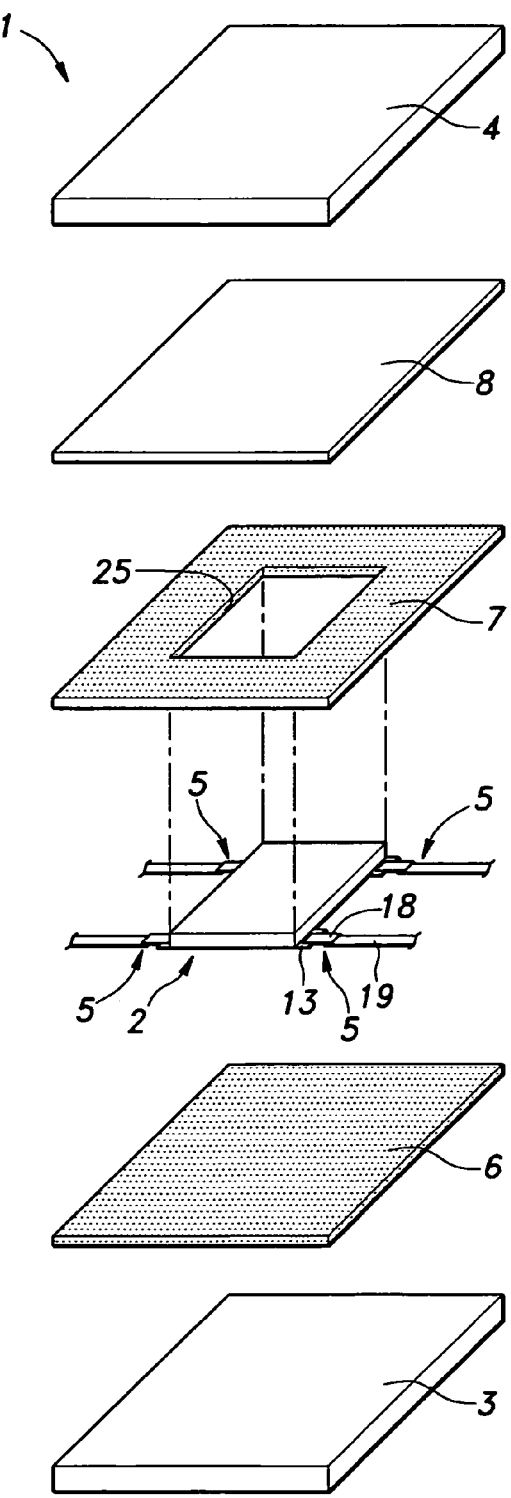
FIG. 1 is an exploded perspective view of a laminated glass assembly incorporated with an organic EL panel given as a first embodiment of the present invention.

As shown in FIG. 1, the laminated glass assembly 1 of the first embodiment comprises a first glass sheet 3, a second glass sheet 4, an organic EL panel 2, wiring 5 connected to the organic EL panel 2, a first intermediate film 6, a second intermediate film 7 and a third intermediate film 8. The first glass sheet 3 and the second glass sheet 4 are made of soda-lime glass, and may each consist of a per se known float glass sheet having a smooth surface. The first glass sheet 3 and the second glass sheet 4 may be made of glass materials that are transparent, and may be given with properties to absorb light of specific wavelengths such as ultraviolet light and infrared light. The outer surfaces of the first glass sheet 3 and the second glass sheet 4 may be coated with a per se known anti-reflective, infrared reflective or ultraviolet reflective coating or film. The thickness of at least one of the first glass sheet 3 and the second glass sheet 4 may be in the range of 0.5 mm to 2.5 mm, or more preferably in the range of 1.0 mm to 1.6 mm. In the illustrated embodiment, the first glass sheet 3 and the second glass sheet 4 both have a thickness of 1.5 mm. Alternatively, the thickness of at least one of the first glass sheet 3 and the second glass sheet 4 may be in the range of 2.0 mm to 4.0 mm. The thickness as used in this specification shall mean the dimension of the glass sheet measured in the thickness-wise direction or the direction of lamination.

Figure 2:
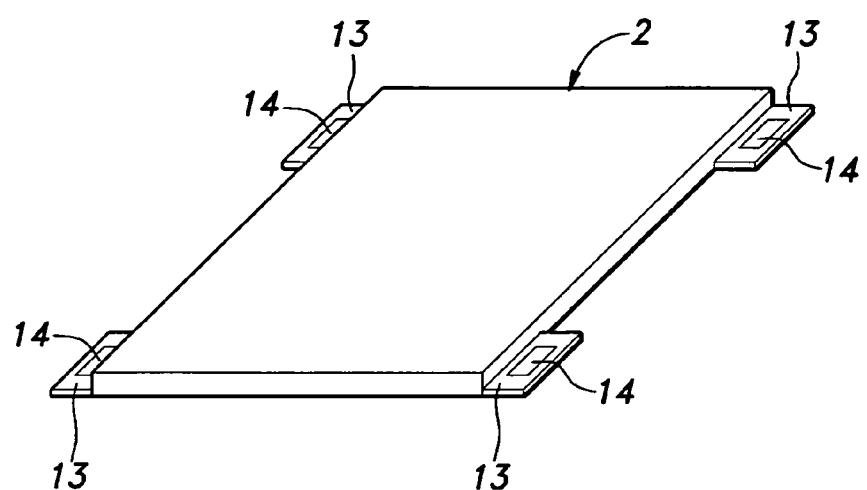
FIG. 2 is a perspective view of the organic EL panel of the first embodiment of the present invention.

FIG. 2 shows the organic EL panel 2. The organic EL panel 2 may consist of a per se known panel having organic EL encapsulated therein, and may be in the form of a rectangular sheet having a thickness of 0.3 mm to 1.0 mm. The organic EL panel 2 includes terminal members 13 consisting of thin strips extending from either end of each of a pair of opposing sides. Each terminal member 13 has a thickness of 0.05 mm to 0.15 mm or substantially thinner than the organic EL panel 2, and is positioned so as to be flush with the lower surface of the organic EL panel 2. A terminal 14 forming a part of an electroconductive pattern is exposed on the front surface of each terminal member 13.

A lead wire of the wiring 5 is connected to the terminal 14 of each terminal member 13 of the organic EL panel 2. Each lead wire of the wiring 5 includes a first wiring member 18 and a second wiring member 19 each consisting of a thin strip of electroconductive material, a first solder 21 connecting the first wiring member 18 with the terminal 14, and a second solder 22 connecting the first wiring member 18 with the second wiring member 19. The first wiring member 18 and the second wiring member 19 may each consist of a thin strip of metallic material such as copper foil and aluminum foil, and may be plated and covered by an insulating coating. The first wiring member 18 and the second wiring member 19 may have a thickness of 0.05 mm to 0.10 mm at each connecting portion, and a width of 3 mm to 15 mm. The first solder 21 and the second solder 22 may have a thickness of 0.01 mm to 0.2 mm. The first wiring member 18 and the second wiring member 19 may have a thickness, a width and a length in the afore-mentioned ranges including the insulating coating if any such insulating coating is present.

Figure 4:
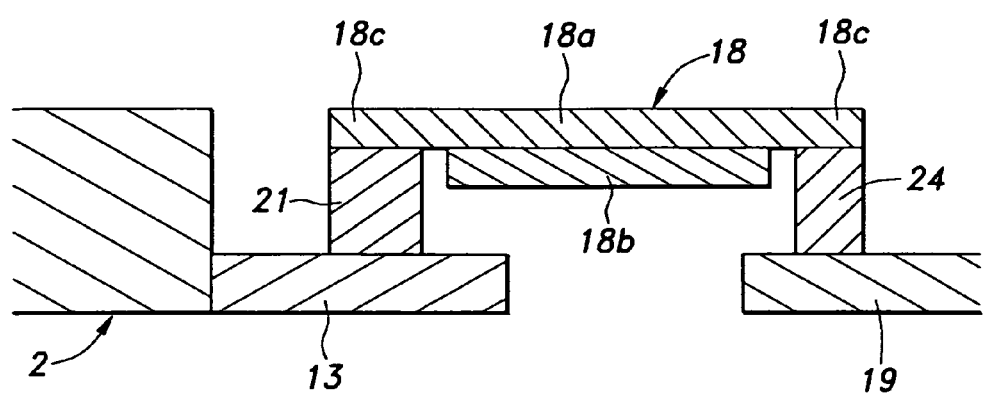
FIG. 4 is an enlarged view of a part indicated by IV in FIG. 3.

As shown in FIG. 4, the first wiring member 18 is formed by laminating a plurality of layers of copper foil 18a, 18b (two layers in the illustrated embodiment) each having a thickness of 0.03 mm to 0.10 mm. The copper foil 18a, 18b may be plated on the surface. The two layers of copper foil 18a, 18b are laminated with a certain longitudinal offset such that one of the layers of the copper foil 18a protrudes with respect to the other at each end portion 18c thereof, thereby defining a stepped portion. In other words, the first wiring member 18 has a thickness of a single layer of copper foil in each end portion 18c thereof, and a thickness of two layers of copper foil in the central portion thereof. The first wiring member 18 is connected to the first solder 21 and the second solder 22 at the parts thereof consisting of a single layer of copper foil. Thus, the first wiring member 18 including the two layers of copper foil 18a, 18b is provided with the two end portions 18c which are connected to the first and second solders 21 and 22, respectively, and each formed by only one of the two layers of copper foil 18a protruding therefrom and having a thickness of 0.05 mm to 0.10 mm. Thereby, the main part of the first wiring member 18 is given with a large cross sectional area so as to minimize electric resistance, and each end portion 18c that is laid over the corresponding solder 21, 22 is given with a reduced thickness. Each end portion 18c of the first wiring member 18 is joined with the corresponding solder 21, 22 so that an effective cross sectional area required for ensuring an adequate electric conductance can be ensured to the end portions 18c in spite of the reduced thickness thereof. As an alternate embodiment, the first wiring member 18 may consist of a single layer of copper foil having a thickness of 0.05 mm to 0.10 mm.

A first connecting portion 23 formed by joining each first wiring member 18 to the corresponding terminal member 13 via the first solder 21 is provided with a thickness of 0.16 mm to 0.40 mm as a sum of the thicknesses of the end portion 18c of the first wiring member 18, the first solder 21 and the terminal member 13. Preferably, in the first connecting portion 23, the total thickness of the end portion 18c of the first wiring member 18, the first solder 21 and the terminal member 13 is less than 6.6% of the width of the end portion 18c of the first wiring member 18.

A second connecting portion 24 formed by joining each first wiring member 18 to the second wiring member 19 via the second solder 22 is provided with a thickness of 0.16 mm to 0.40 mm as a sum of the thicknesses of the end portion 18c of the first wiring member 18, the second solder 22 and the second wiring member 19. Preferably, in the second connecting portion 24, the total thickness of the end portion 18c of the first wiring member 18, the first solder 21 and the second wiring member 19 is less than 6.6% of the width of the narrower of the end portion 18c of the first wiring member 18 and the second wiring member 19.

The first intermediate film 6, the second intermediate film 7 and the third intermediate film 8 each consist of a sheet of thermoplastic resin which in this embodiment consists of polyvinyl butyral (PVB). In alternate embodiments, the thermoplastic resin may consist of such other materials as polyvinyl acetal, ethylene-vinyl acetate (EVA) and polyurethane. The third intermediate film 8 is 0.3 mm to 1.0 mm in thickness, and is highly transparent with a visible light transmissivity of 70% or higher. The first intermediate film 6 and the second intermediate film 7 are each 0.3 mm to 0.8 mm in thickness, and contain pigment dispersed in polyvinyl butyral so as to demonstrate a visible light transmissivity which is lower than that of the third intermediate film 8. The visible light transmissivity of the first intermediate film 6 and the second intermediate film 7 is preferably 10% or less, or more preferably 1% or less. In the illustrated embodiment, the first intermediate film 6, the second intermediate film 7 and the third intermediate film 8 each have a thickness of 0.38 mm.

As shown in FIG. 1, the first intermediate film 6, the second intermediate film 7 and the third intermediate film 8 are conformal to the first and second glass sheets 3 and 4 so that these films may extend over the entire surface of the first and second glass sheets 3 and 4. The second intermediate film 7 is formed with a rectangular opening 25 passed through the thickness thereof. The opening 25 is conformal to the organic EL panel 2 so as to receive the organic EL panel 2 therein. The second intermediate film 7 overlaps with the terminal members 13 and the wiring 5.

Figure 3:
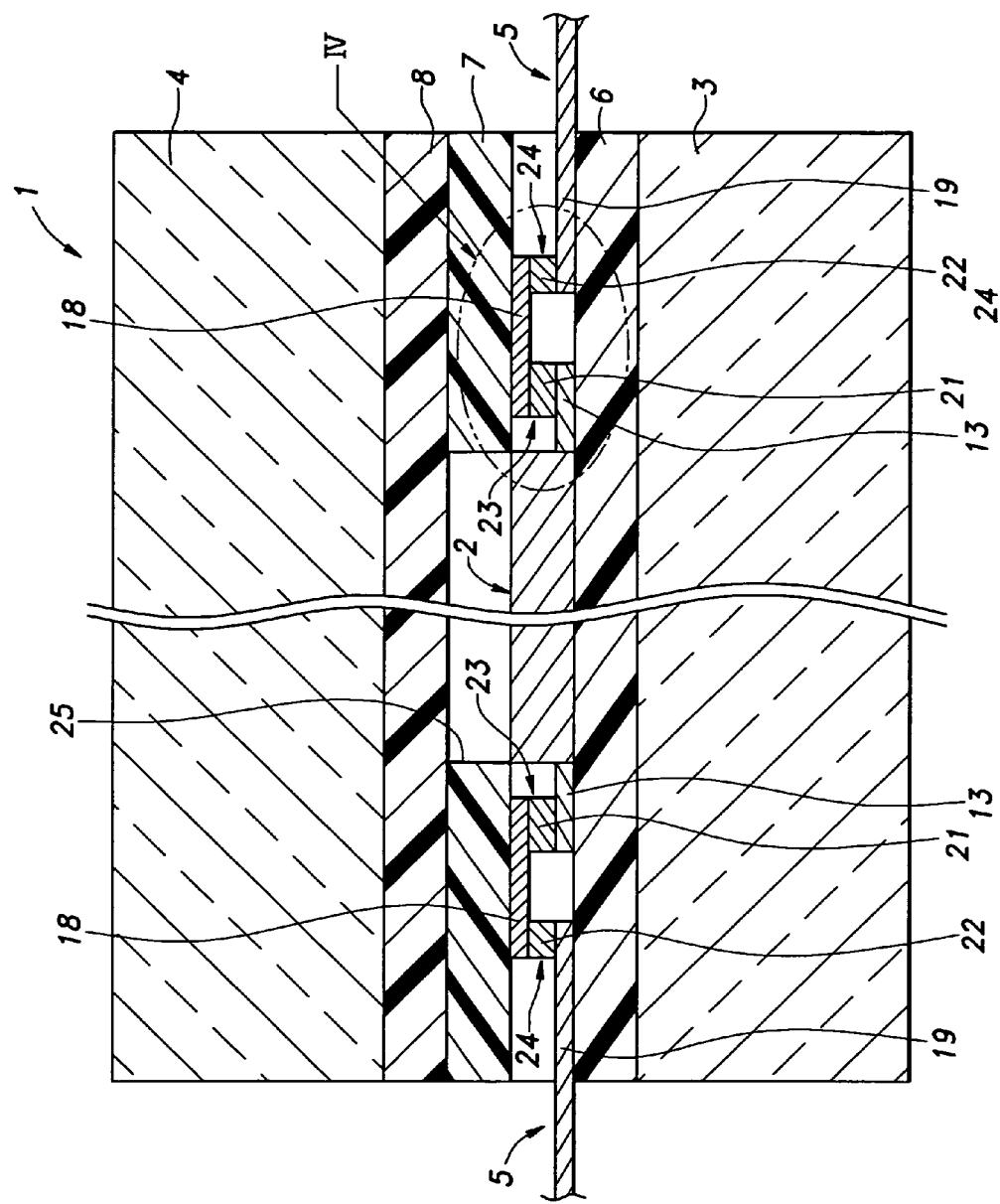
FIG. 3 is a sectional view of the laminated glass assembly incorporated with an organic EL panel of the first embodiment prior to the bonding process by pressing and heating.

As shown in FIGS. 1 and 3, the laminated glass assembly 1 is formed by laminating the first glass sheet 3, the first intermediate film 6, the second intermediate film 7, the third intermediate film 8 and the second glass sheet 4, in that order, and the organic EL panel 2 and the wiring members are interposed between the first intermediate film 6 and the second intermediate film 7. The organic EL panel 2 is received in the rectangular opening 25 of the second intermediate film 7, and the terminal members 13 are interposed between the first intermediate film 6 and the second intermediate film 7. Preferably, the outer edge of the organic EL panel 2 touches the opposing edge of the rectangular opening 25. As shown in FIG. 3, because the organic EL panel 2 has an irregular surface, some gaps are present between the first intermediate film 6, the second intermediate film 7 and the third intermediate film 8 when these films are simply layered one on another.

Figure 5:
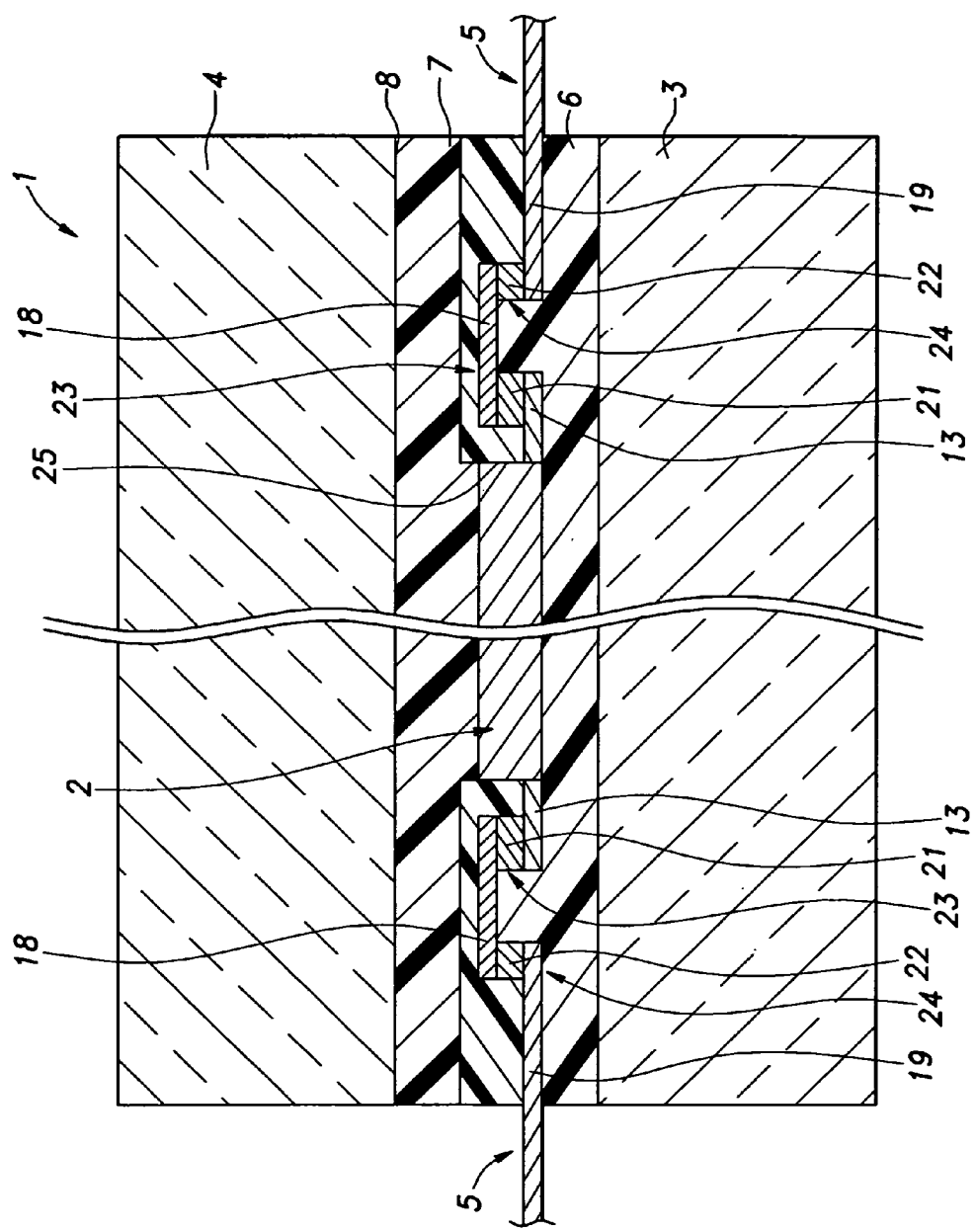
FIG. 5 is a sectional view of the laminated glass assembly incorporated with an organic EL panel of the first embodiment following the bonding process by pressing and heating.

By pre-pressing the assembly in the state illustrated in FIG. 3 and applying both pressure and heat thereto for bonding (in a vacuum press, nip rolls and an autoclave), the gaps that may be present between the organic EL panel 2 and the intermediate films 6 to 8 are eliminated so that an integrally joined laminated glass assembly 1 as shown in FIG. 5 is completed. During the bonding process using both pressure and heat, the intermediate films 6 to 8 that are softened by heating are allowed to penetrate into the gaps between the organic EL panel 2 and the intermediate films 6 to 8 while the air trapped in the gaps is evacuated by vacuum (or depressurization).

As shown in FIG. 5, in this laminated glass assembly 1, the organic EL panel 2 is visible from outside via the rectangular opening 25 as well as via the third intermediate film 8 and the second glass sheets 4 that are transparent. On the other hand, the terminal members 13, the first wiring members 18 and the second wiring members 19 are not visible from the side of the second glass sheets 4 because this side is covered by the second intermediate film 7 having a low transmissivity for visible light. The organic EL panel 2 is not visible from the side of the second glass sheets 4 because this side is covered by the first intermediate film 6 having a low transmissivity for visible light.

In this embodiment, because the organic EL panel 2 is received in the rectangular opening 25 of the second intermediate film 7, the first glass sheet 3 and the second glass sheet 4 are prevented from receiving localized stress from the organic EL panel 2. Therefore, the first glass sheet 3 and the second glass sheet 4 are prevented from cracking that could be otherwise caused by the presence of the organic EL panel 2.

Because the first connecting portion 23 and the second connecting portion 24 are each provided with a thickness of 0.16 mm to 0.40 mm, the wiring 5 is prevented from applying localized stress to the first glass sheet 3 and the second glass sheet 4 at each of these connecting portions or causing any stress concentration in the first glass sheet 3 and the second glass sheet 4 at parts thereof corresponding to these connecting portions so that the possibility of causing cracks in the first glass sheet 3 and the second glass sheet 4 can be minimized. By reducing the thickness of the first connecting portion 23 and the second connecting portion 24 to no less than 0.16 mm, the electric resistance can be reduced to such an extent that an adequate electric conductance can be achieved. In particular, at the first connecting portion 23, by selecting the ratio of the total thickness of the end portion 18c of the first wiring member 18, the first solder 21 and the terminal member 13 to the width of the first wiring member 18 to be 6.6% or less, the variation in the thickness for a unit length can be minimized (or the projection created by the first connecting portion 23 is blunted) so that the first connecting portion 23 and the second connecting portion 24 are prevented from applying localized loads to the first glass sheet 3 and the second glass sheet 4. Likewise, at the second connecting portion 24, by selecting the ratio of the total thickness of the first wiring member 18, the second solder 22 and the second wiring member 29 to the width of the narrower of the first wiring member 18 and the second wiring member 19 to be 6.6% or less, the variation in the thickness for a unit length can be minimized so that the first connecting portion 23 and the second connecting portion 24 are prevented from applying localized loads to the first glass sheet 3 and the second glass sheet 4.

As a modification of the laminated glass assembly 1 of the first embodiment, the first glass sheet 3 may be tinted in a per se known manner (privacy glass with a visible light transmissivity of 5% or less) while the visible light transmissivity of the first intermediate film 6 is 70% or greater. In this case also, the organic EL panel 2 is not visible from the side of the first glass sheet 3.

Figure 6:
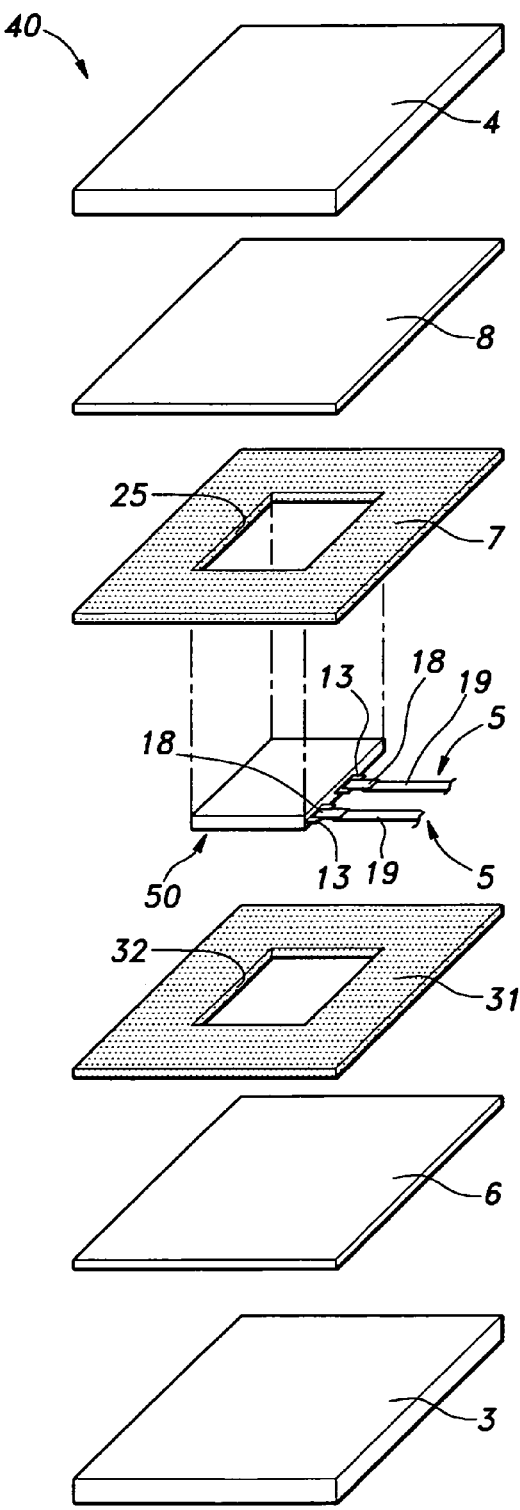
FIG. 6 is an exploded perspective view of a laminated glass assembly incorporated with a variable light transmission device given as a second embodiment of the present invention.

The laminated glass assembly 30 of the second embodiment is described in the following. As shown in FIG. 6, the laminated glass assembly 30 differs from the previously discussed laminated glass assembly 1 in that a fourth intermediate film 31 is provided between the first intermediate film 6 and a variable light transmission device 50 (including the wiring 5 therefor), the visible light transmissivity of the first intermediate film 6 is 70% or higher, and the positioning of the terminal members 13 of the variable light transmission device 50 is different. The laminated glass assembly 30 of the second embodiment is otherwise similar to the previously discussed laminated glass assembly 1 so that like parts are denoted with like numerals without repeating the description of such parts. The fourth intermediate film 31 may consist of a sheet of thermoplastic resin (which consists of polyvinyl butyral in this embodiment) similar to the material of the first to the third intermediate films 6 to 8. The fourth intermediate film 31 has a thickness of 0.30 mm to 0.80 mm, and contains pigment or dye dispersed therein so that the visible light transmissivity thereof is 10% or less, or more preferably 1% or less.

As shown in FIG. 6, the fourth intermediate film 31 is formed with a rectangular opening 32 passed through the thickness thereof at the part thereof corresponding to the variable light transmission device 50. The rectangular opening 32 is conformal to the variable light transmission device 50 so that the variable light transmission device 50 is received by both of these rectangular openings 25 and 32. A pair of terminal members 42 each consisting of a thin strip having a thickness of 0.1 mm extends perpendicularly from the side wall surface of the variable light transmission device 50 at a middle point of the thickness of the side wall. The structure of these terminal members 42 is similar to that of the terminal members 13 of the first embodiment, and each terminal member 42 is provided with a terminal not shown in the drawing to which the corresponding first wiring member 18 is connected via a first solder 21. The terminal members 42 and the wiring 5 are interposed between the fourth intermediate film 31 and the second intermediate film 7, and are shielded from external view.

Figure 7:
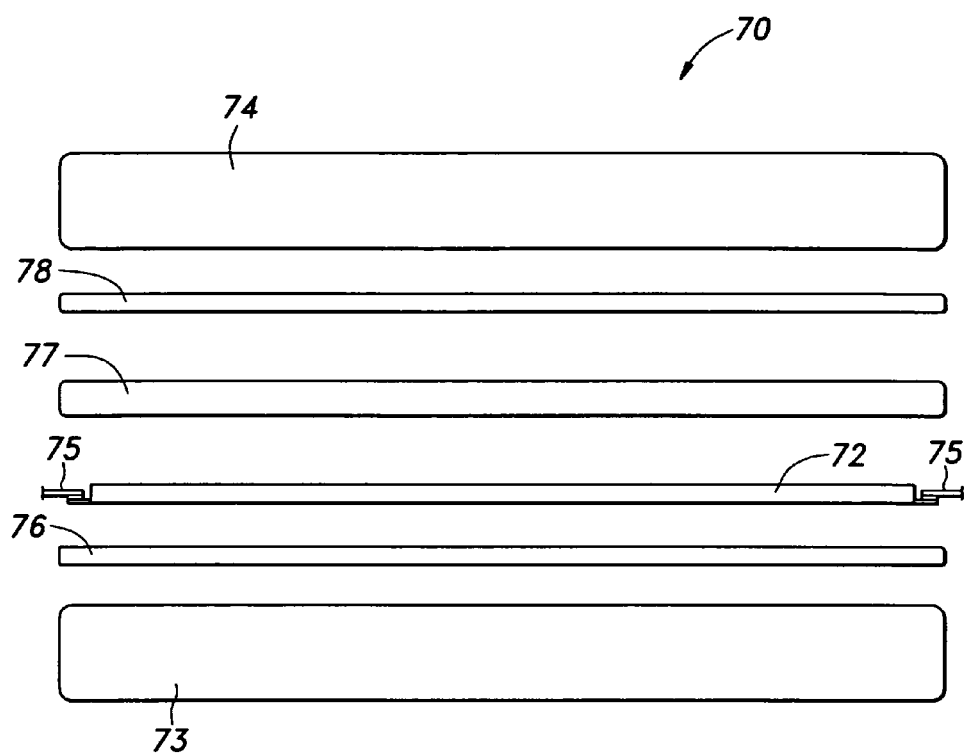
FIG. 7 is an exploded perspective view of a laminated glass assembly incorporated with a variable light transmission sheet given as a third embodiment of the present invention.
Figure 8:
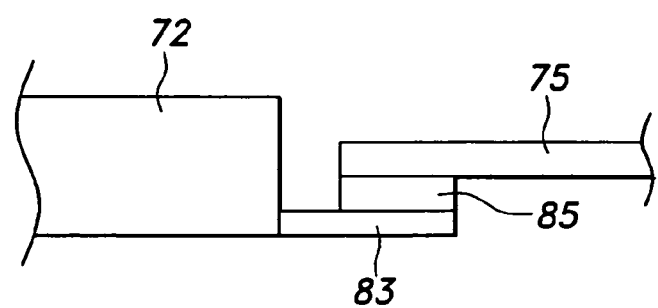
FIG. 8 is a sectional view of the variable light transmission sheet of the third embodiment.

The laminated glass assembly 70 of the third embodiment incorporated with a variable light transmission sheet 72 is described in the following with reference to FIGS. 7 and 8. As shown in FIGS. 7 and 8, the laminated glass assembly 70 includes a first glass sheet 73, a second glass sheet 74, a variable light transmission sheet (device) 72, a flexible wire harness 75 connected to the variable light transmission sheet 72, a first intermediate film 76, a second intermediate film 77 and a third intermediate film 78. The laminated glass assembly 70 is formed by laminating the first glass sheet 73, the first intermediate film 76, the variable light transmission sheet 72, the second intermediate film 77, the third intermediate film 78 and the second glass sheet 74, in that order.

The first and second glass sheets 73 and 74 may be made of the same material and have a similar thickness as the first and second glass sheets 3 and 4 of the first embodiment. The first to third intermediate films 76 to 78 may be made of the same material and have a similar thickness as the first to third intermediate films 6 to 8 of the first embodiment. In the illustrated embodiment, the first and second glass sheets 73 and 74 are made of transparent glass sheets, the first and third intermediate films 76 and 78 are made of transparent polyvinyl butyral, and the second intermediate film 77 is made of polyvinyl butyral having a property to absorb ultraviolet light. The second intermediate film 77 is made of polyvinyl butyral containing a material that absorbs ultraviolet light such as iron and titanium so that the ultraviolet light transmissivity is lower than 50% or less.

The thicknesses of the various layers of the laminated glass assembly 70 may be selected such that the first glass sheet 73 is 2.1 mm thick, the second glass sheet 74 1.3 mm, the first intermediate film 76 0.38 mm, the second intermediate film 77 0.76 mm, and the third intermediate film 78 0.38 mm, for instance.

The variable light transmission sheet 72 may be of a per se known type, and may have a thickness of 0.3 mm to 1.0 mm. A pair of terminal members 83 consisting of thin strips project from either end of each of a pair of opposite edges of the variable light transmission sheet 72. Each terminal member 83 may be made of copper foil, for instance, provided with a bonding layer on the surface thereof, and has a thickness of 0.05 mm to 0.15 mm. Each terminal member 83 is thinner than the variable light transmission sheet 72, and is positioned to be flush with the lower surface of the variable light transmission sheet 72. The upper surface of each terminal member 83 is connected to a flexible wire harness 75 consisting of a flexible thin strip of electroconductive material by using a solder 85. The flexible wire harness 75 has a thickness of 0.3 mm to 1.0 mm, and the solder 85 has a thickness of 0.01 mm to 0.2 mm. The terminal member 83, the solder 85 and the flexible harness 75 are layered in that order in the thickness-wise direction of the laminated glass assembly 70, and are bonded to each other. The bonded parts of the terminal member 83, the solder 85 and the flexible harness 75 are positioned between the first glass sheet 73 and the second glass sheet 74, and are interposed between the first and second intermediate films 77 and 78.

Figure 9:
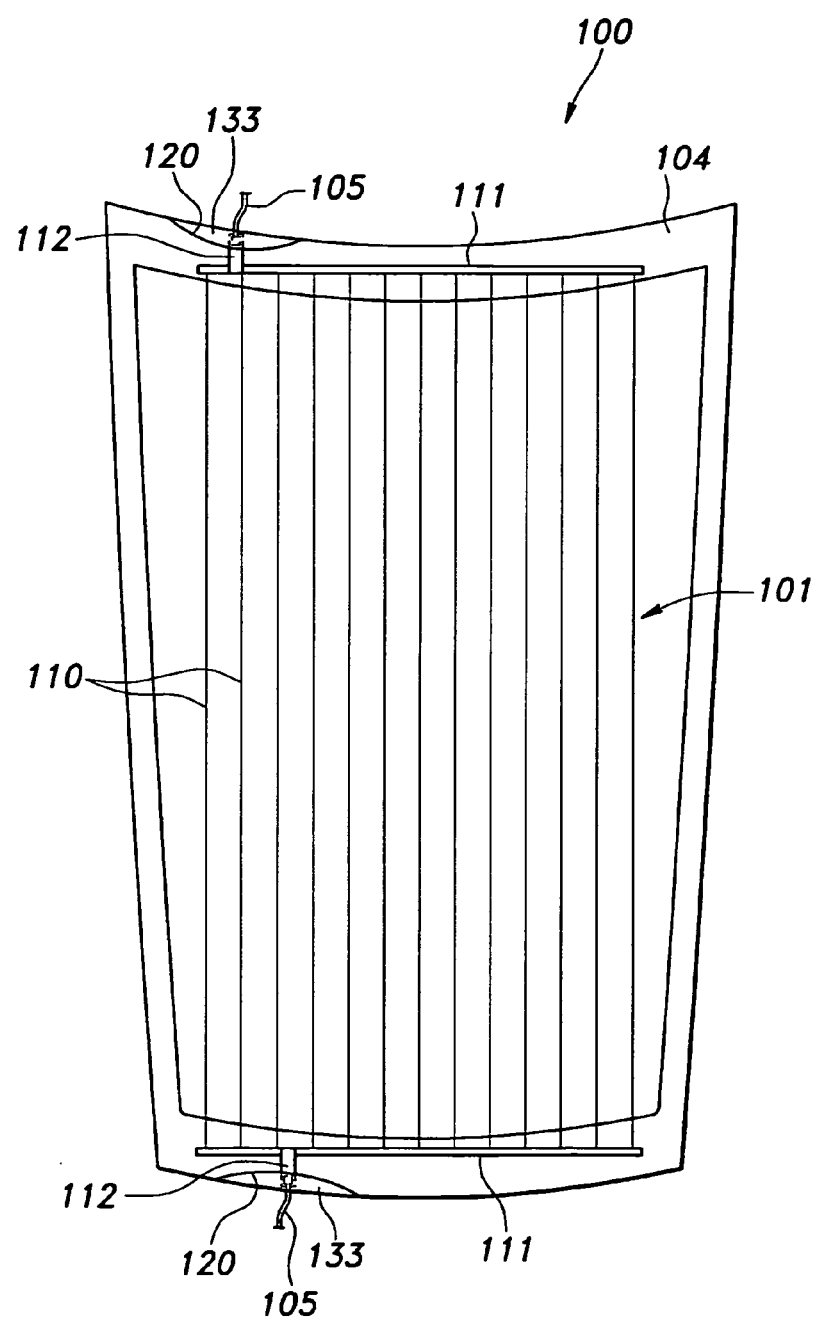
FIG. 9 is a plan view of a laminated glass assembly incorporated with electric heat wires given as a fourth embodiment of the present invention.
Figure 10:
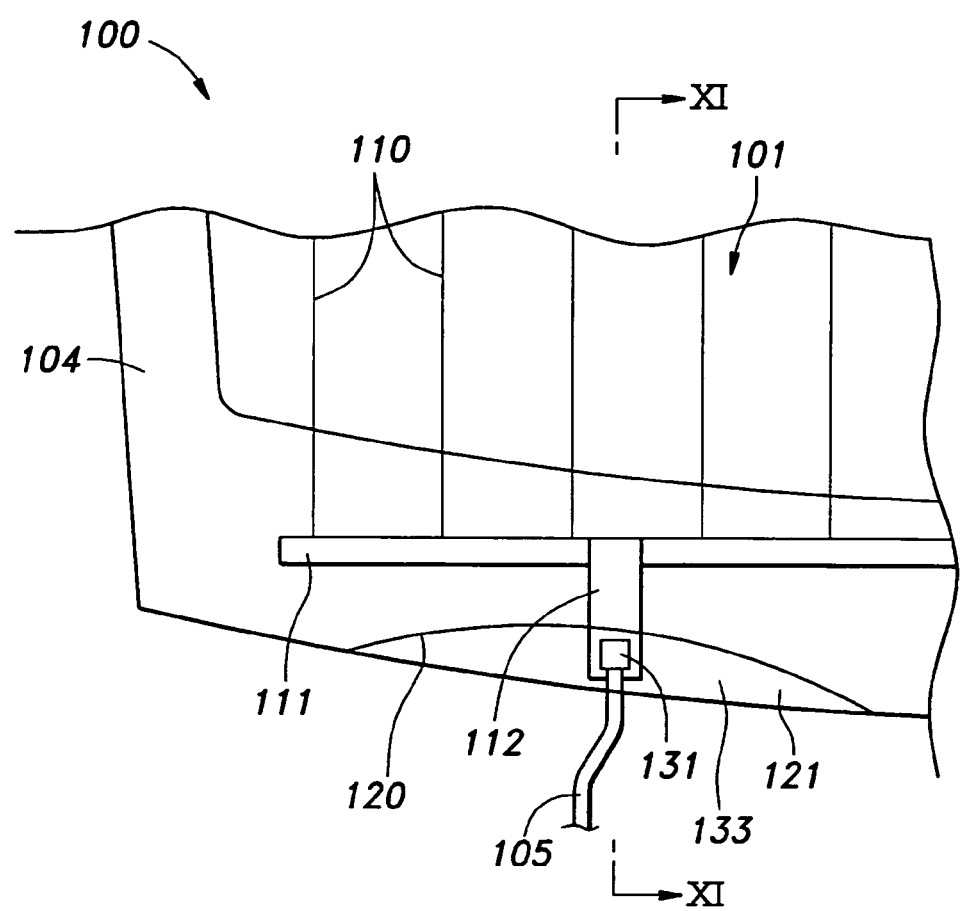
FIG. 10 is a plan view of an essential part of the laminated glass assembly incorporated with electric heat wires of the fourth embodiment.
Figure 11:
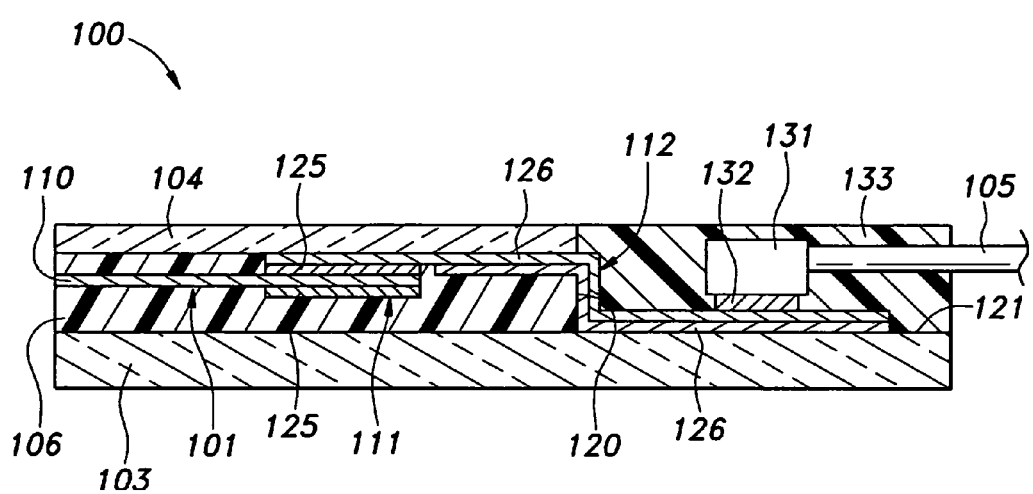
FIG. 11 is a sectional view taken along line XI-XI of FIG. 10.

A laminated glass assembly 100 incorporated with a defogging device 101 given as a fourth embodiment of the present invention is described in the following with reference to FIGS. 9 to 11. As shown in FIGS. 9 to 11, a laminated glass assembly 100 includes a first glass sheet 103, a second glass sheet 104, a defogging device 101, lead wires 105 connected to the defogging device 101 and an intermediate film 106. The defogging device 101 includes a plurality of electric heat wires 110, a pair of first bus bars 111 connected to the opposite ends of the electric heat wires 110, respectively, and a pair of second bus bars 112 connecting the respective first bus bars 111 to the corresponding lead wires 105. The laminated glass assembly 100 is formed by laminating the first glass sheet 103, the intermediate film 106, the defogging device 101 and the second glass sheet 104, in that order.

The materials and the thicknesses of the first glass sheet 103, the second glass sheet 104 and the intermediate film 106 are similar to those of the first embodiment. The first glass sheet 103 and the second glass sheet 104 are substantially rectangular and conformal to each other. The size of the first glass sheet 103 and the second glass sheet 104 may be selected at will, but are preferably less than 1,200 mm in height and less than 1,600 mm in width.

The first glass sheet 103 and the second glass sheet 104 may be curved with a prescribed curvature. The radius of curvature may range between 1,000 mm and 10,000 mm, for instance. The curvature of the first glass sheet 103 and the second glass sheet 104 may not be uniform, but may vary depending on the regions thereof.

A cutout 120 is formed on each of the upper and lower edges of the second glass sheet 104. Each cutout 120 is defined by an arcuate cut as seen in plan view of the second glass sheet 104, and is passed through the thickness of the second glass sheet 104. The arcuate edge of each cutout 120 may have a curvature of 130 mm or greater. Each cutout is about 15 mm in depth at the part thereof most recessed from the side edge profile of the second glass sheet 104.

Each cutout 120 may be provided at any lateral position on the upper or lower edge of the second glass sheet 104. Preferably, each cutout 120 is provided at a distance of more than 50 mm from either end of the upper or lower edge of the second glass sheet 104. The cutouts 120 provided on the upper and lower edges of the second glass sheet 104 may be placed opposite to each other, or may be positioned in any other relationships.

The intermediate film 106 is also provided with a cutout corresponding to each of the cutouts 120. The presence of the cutout in the intermediate film 106 allows the first glass sheet 103 to be exposed in each cutout 120 so as to define an exposed support surface 121.

The defogging device 101 is provided with a pair of first bus bars 111 that are each formed by laminating a pair of thin strips 125, and each strip 125 includes a copper main body and tin plating which serves as low melting point solder having a melting point of 124° C. Each thin strip 125 has a thickness of 0.05 mm to 0.10 mm, and a width of 5 mm to 20 mm. The first bus bars 111 are positioned between the intermediate film 106 and the second glass sheet 104. One (lower) of the first bus bar 111 extends laterally adjacent to the lower edge of the second glass sheet 104, and the other (upper) first bus bar 111 extends laterally adjacent to the upper edge of the second glass sheet 104. Each bus bar 111 is positioned so as not to overlap with the cutouts 120.

The electric heat wires 110 are made of tungsten, for instance. Each electric heat wire 110 has a density of 19.25 g/cm3, and a wire diameter of 0.015 mm to 0.030 mm, for instance. Each electric heat wire 110 is connected to the upper first bus bar 111 at one (upper) end thereof and to the lower first bus bar 111 at the other (lower) end thereof. Each end of the electric heat wires 110 is interposed between the two thin strips 125 forming the corresponding first bus bar 111, and is bonded thereto by means of the partial melting of the thin strips 125. The thin strips 125 are caused to be partially melted by the heat of the autoclave for forming the laminated glass assembly 100, and are thereby bonded to the electric heat wire 110.

In the illustrated embodiment, the electric heat wires 110 extend vertically and linearly in parallel to one another. In other embodiments, the electric heat wires 110 may be curved and/or bent in various patterns.

Each second bus bar 112 is formed by laminating a pair of thin strips 126, but may also be formed by bending over a single this strip 126 into two layers. The thin strips 126 may contain a copper main body and tin plating which serves as a low melting point solder having a melting point of 124° C. Each thin strip 126 has a thickness of 0.05 mm to 0.10 mm, and a width of 5 mm to 20 mm. In each second bus bar 112, one of the thin strips 126 is trimmed at one end portion thereof, thereby defining an end portion consisting of a single thin strip 126. The end portion of each second bus bar 112 is laid over the corresponding first bus bar 111. In other words, each first bus bar 111 and the corresponding second bus bar 112 are layered in the thickness direction of the laminated glass assembly 100, and are bonded to each other. The bonded parts of the first bus bars 111 and the second bus bars 112 are at least partially melted by the heat of the autoclave used for forming the laminated glass assembly 100, and are thereby formed as such.

Each of the connecting portions of the first and second bus bars 111 and 112 has a thickness given as a sum of the thicknesses of the two thin strips 125 of the first bus bar 11 and the single strip 126 of the second bus bar 112. When the second bus bar 112 is joined to the part of the first bus bar 111 where any one of the electric heat wires 110 is interposed, the connecting part has a thickness given as a sum of the two thin strips 125 of the first bus bar 111, the single electric heat wire 110 and the thin strip 126 of the second bus bar 112.

The other end of the second bus bar 112 protrudes into the cutout 120 from between the first and second glass sheets 103 and 104, and is bonded to the support surface 121 of the first glass sheet 103 by using a bonding agent. The other end of the second bus bar 112 positioned in the cutout 120 is connected to a terminal member 131 provided at the opposing end of the lead wire 105 leading to a power source, by using per se known solder such as lead solder and lead-free solder.

Each cutout 120 is filled with a sealant 133, and the end portion of the second bus bar 112 and the terminal member 131 of the lead wire 105 are covered by the sealant 133. The sealant 133 may consist of per se known resin such as polyurethane and silicone resin. The sealant 133 is molded so as to define surfaces which are coincidental with the surface of the second glass sheet 104 and the end surface of the first glass sheet 103.

The manufacturing process of the laminated glass assembly 100 is described in the following. First of all, the intermediate film 106 is laminated on the inner surface of the first glass sheet 103, and a plurality of electric heat wires 110 are placed on the upper surface of the intermediate film 106.

A pair of first bus bars 111 are arranged thereon, and each of the end portions of the electric heat wires 110 is interposed between the two thin strips 125 of the corresponding first bus bar 111. It is also possible to place the single thin strip 125 of each first bus bar 111 on the intermediate film, to place each end of the electric heat wires 110 thereon, and to place the other single thin strip 125 thereof so as to interpose each heat electric wire 110 between the two thin strips 125. Then, each of the end portions of the second bus bars 112 consisting of a single thin strip 125 is laminated over the corresponding part of the first bus bars 111 in a thickness-wise direction, and the other end of the corresponding second bus bar 112 is placed at the prescribed portion in the corresponding cutout 120. The parts where the first and second bus bars 111 and 112 are laminated with each other may be thermally joined to each other at this timing. The electric heat wires 110, the first bus bars 111 and the second bus bars 112 are then interposed between the intermediate film 106 and the second glass sheet 104.

The laminated assembly consisting of the first glass sheet 103, the intermediate film 106, the electric heat wires 110, the first bus bars 111, the second bus bars 112 and the second glass sheet 104 is pre-pressed. In the pre-pressing process, the laminated assembly is placed in an air tight bag which is then evacuated for a few minutes (at −700 mm Hg) at room temperature (25° C.), and then evacuated again for 70 minutes (at −700 mm Hg) at a temperature of 110° C.

Following this pre-pressing process, the laminated assembly is autoclaved under a 135° C. and −9.5 atmospheric pressure condition. By this autoclaving process, the material of the thin strips 125 of the first bus bars 111 and the thin strips 126 of the second bus bars 112 are at least partially melted so that the bonding between the thin strips 125 of each first bus bar 111, between each electric heat wire 110 and the thin strips 125 of the corresponding first bus bar 111, and between the thin strip 126 of each second bus bar 112 and the thin strips 125 of the corresponding first bus bar 111 may be achieved. Because each bonded part between the electric heat wires 110 and the first bus bars 111 are layered in the thickness wise direction of the laminated glass assembly 100, the pressure during the autoclaving process causes the bonded part to be firmly interposed between the first and second glass sheets 103 and 104 so that a reliable bonding can be achieved.

Because the autoclaving softens the intermediate film 106, the electric heat wires 110, the first bus bars 111 and the second bus bars 112 are pushed into the intermediate film 106, and get buried therein.

The other end of each second bus bar 112 is then bonded to the support surface 121 exposed in the corresponding cutout 120, and the terminal member 131 of the lead wire 105 is connected to the other end of the second bus bar 112 by solder 132.

EXAMPLES

Organic EL Panel

The laminated glass assembly 1 was manufactured as Inventive Example 1 as described in the following. The first glass sheet 3 and the second glass sheet 4 were made of soda-lime glass, and have a thickness of 1.3 mm (with a tolerance of 0.1 mm). The first glass sheet 3 and the second glass sheet 4 were cut to the size of 820 mm by 1,160 mm. The first to third intermediate films 6 to 8 consisted of polyvinyl butyral film sold by Sekisui Kagaku under the trade name of Slec Film. The organic EL panel 2 had a thickness of 0.3 mm, and the each terminal member 13 thereof had a thickness of 0.1 mm. The first wiring member 18 was formed by laminating a pair of layers of copper foil 18a and 18b each having a thickness of 0.05 mm such that the thickness of the first wiring member 18 is 0.1 mm in the middle portion thereof and 0.05 mm in each end portion. The width and length of the first wiring member 18 were 6.0 mm and 70 mm, respectively. The second wiring member 19 consisted of a single layer of copper foil having a thickness of 0.1 mm and an insulating film having a thickness of 0.05 mm coated on each side thereof such that the second wiring member 19 has a total thickness of 0.2 mm, a width of 6.0 mm and a length of 120 mm. The part of the second wiring member 19 having the second solder 22 deposited thereon had a thickness of 0.1 mm after the insulating film had been removed therefrom.

The first solder 21 and the second solder 22 consisted of Pb/Bi low-melting point solder, and were soldered at a heating temperature of 230° C. The thicknesses of the first solder 21 and the second solder 22 were both 0.15 mm. Therefore, the total thickness of the first connecting portion 23 given as a sum of the thicknesses of the end portion 18c, the first solder 21 and the terminal member 13 was 0.30 mm, and the ratio of the total thickness to the width of the end portion 18c of the first wiring member 18 was 5.0%. The total thickness of the second connecting portion 24 given as a sum of the thicknesses of the first wiring member 18, the second solder 22 and the second wiring member 19 was 0.30 mm while the ratio of the total thickness to the width of the narrower of the first wiring member 18 and the second wiring member 19 was 5.0%.

Inventive Example 2 differed from Inventive Example 1 only in the structure of the first wiring member 18. In the Inventive Example 2, the first wiring member 18 consisted of a single layer of copper foil which has a thickness of 0.10 mm both in the middle part and end parts thereof. Therefore, the total thickness of the first connecting portion 23 given as the sum of the thicknesses of the first wiring member 18, the first solder 21 and the terminal member 13 was 0.35 mm while the ratio of the total thickness to the width was 5.9%. The total thickness of the second connecting portion 24 given as a sum of the thicknesses of the first wiring member 18, the second solder 22 and the second wiring member 19 was 0.35 mm while the ratio of the total thickness to the width of the narrower of the first wiring member 18 and the second wiring member 19 was 5.9%.

Comparative Example 1 was manufactured by changing the thickness of the first wiring member 18 from that of Inventive Example 1. The thickness of the first wiring member in Comparative Example 1 was 0.3 mm. Therefore, the total thickness of the first connecting portion 23 given as the sum of the thicknesses of the first wiring member 18, the first solder 21 and the terminal member 13 was 0.55 mm while the ratio of the total thickness to the width was 9.2%.

The vacuum press (pre-press) process using a vacuum bag was performed on each of Inventive Examples 1 and 2, and Comparative Example 1. In each instance of the vacuum press process, the laminated assembly was placed in a vacuum bag which was then evacuated to a pressure of −0.96 MPa. Eight samples of each of Inventive Examples 1 and 2, and Comparative Example 1 were subjected to the vacuum press process, and the number of samples that cracked was counted. None of the eight samples of each of Inventive Examples 1 and 2 showed any cracks while six out of the eight samples of Comparative Example 1 cracked.

The first to third intermediate films 6 to 8 in Inventive Examples 1 and 2, and Comparative Example 1 were replaced with ethylene-vinyl acetate copolymer film sold by Sekisui Kagaku under the trade name of Slec Film EN (tradename), and these modified Examples were subjected to the vacuum press process under the same condition. These modified Examples produced an identical result.

(Variable Light Transmission Sheet)

The laminated glass assembly 70 incorporated with a variable light transmission sheet 72 was evaluated by manufacturing Inventive Examples 11 to 13, Comparative Examples 14 to 16 and Reference Example 17 as shown in Table 1. The laminated glass assembly 70 was similar to the third embodiment. The first glass sheet 3 and the second glass sheet 4 were made of soda-lime glass made by the float glass process, and had thicknesses as listed in Table 1. Each of these glass sheets 3 and 4 were cut to the size of 820 mm by 1,160 mm.

The first to third intermediate films 6 to 8 consisted of polyvinyl butyral film sold by Sekisui Kagaku under the trade name of Slec Film. The thicknesses of the first to third intermediate films 6 to 8 were 0.38 mm, 0.76 mm and 0.38 mm, respectively.

The thickness of the variable light transmission sheet 72 was 0.4 mm. The terminal member 83 of the variable light transmission sheet 72 had a width of 15 mm and thicknesses listed in Table 1. The thicknesses and widths of the flexible harness 75 and the solder 85 are given in Table 1.

at least one of the first and second so glass sheets 73 and 74 was counted. Examples which developed cracks are indicated by "yes," and those which did not are indicated by "no."

As for Inventive Examples 11 to 13 in which one of the glass sheets or the second glass sheet 74 had a thickness of 10. mm to 1.6 mm, and the total thickness of the connecting portion formed by the terminal member 83, the solder 85 and the flexible harness 75 was 0.4 mm or smaller, no cracks were observed. On the other hand, cracks were observed in Comparative Examples 14 and 15 in which the total thickness of the connecting portion formed by the terminal member 83, the solder 85 and the flexible harness 75 was greater than 0.4 mm. Cracks were observed also in Comparative Example 16 in which the thickness of the solder 85 was 0.3 mm. Reference Example 17 demonstrated no cracks owing to the fact that the first glass sheet 73 and the second glass sheet 74 both had a thickness of 2.1 mm.

(Defogging Device)

The laminated glass assembly 100 incorporated with a defogging device 101 was evaluated by manufacturing Inventive Examples 21 to 25, Comparative Examples 26 and 27 and Reference Example 28 as shown in Table 2. The laminated glass assembly 100 was similar to the fourth embodiment. The first glass sheet 3 and the second glass sheet 4 were made of soda-lime glass made by the float glass process, and had thicknesses as listed in Table 2. Each of these glass sheets 3 and 4 were cut to the size of 903 mm by 543 mm.

The intermediate film 106 consisted of polyvinyl butyral film sold by Sekisui Kagaku under the trade name of Slec Film, and had a thickness of 0.73 mm.

The electric heat wires 110 were made of tungsten wire, and had thicknesses as listed in Table 2. Each of the first and second bus bars 111 and 112 consisted of a thin strip or two layers of thin strips 125 and 126 each made of a copper member coated with tin plating. Each first bus bar 111 consisted of a pair of layers of thin strips 125, and each second bus bar 112 consisted of a single thin strip 126. Therefore, each of the connecting portions between the first bus bars 111 and the second bus bars 112 was formed by

TABLE 1

| | 1st glass sheet thickness (mm) | 2nd glass sheet thickness (mm) | flexible harness A (mm) thickness | flexible harness A (mm) width | solder B (mm) thickness | terminal member C (mm) thickness | total thickness A + B + C (mm) | cracks |
|---|---|---|---|---|---|---|---|---|
| Inventive Example 11 | 2.1 | 1.3 | 0.1 | 6 | 0.1 | 0.07 | 0.27 | no |
| Inventive Example 12 | 2.1 | 1 | 0.1 | 6 | 0.2 | 0.07 | 0.37 | no |
| Inventive Example 13 | 2.1 | 1 | 0.1 | 6 | 0.1 | 0.2 | 0.4 | no |
| Comparative Example 14 | 2.1 | 1.3 | 0.1 | 6 | 0.4 | 0.07 | 0.47 | yes |
| Comparative Example 15 | 2.1 | 1 | 0.1 | 6 | 0.4 | 0.07 | 0.37 | yes |
| Comparative Example 16 | 2.1 | 1 | 0.1 | 6 | 0.3 | 0.07 | 0.37 | yes |
| Reference Example 17 | 2.1 | 2.1 | 0.1 | 6 | 0.4 | 0.07 | 0.47 | no |

The vacuum press (pre-press) process using a vacuum bag was performed for bonding purpose on each of the laminated assemblies of Examples 11 to 17. In each instance of the vacuum press process, the laminated assembly listed in Table 1 was placed in a vacuum bag which was then evacuated to a pressure of −0.96 MPa. Eight samples of each of Examples 11 to 17 were subjected to the vacuum press process, and the number of samples that produced cracks in three layers of thin strips 125 and 126. The first and second bus bars 111 and 112 were provided with a same thickness and a same width of 10 mm. In Comparative Example 27 and Reference Example 28, the second bus bar 112 consisted of six layers of thin strips 126 at each connecting portion so that the total number of the layers of thin strips at each of the connecting portions between the first and second bus bars 111 and 112 was eight.

TABLE 2

| | 1st glass sheet thickness (mm) | 2nd glass sheet thickness (mm) | thickness and # of layers at connecting portion between 1st and 2nd bus bars D | diameter of heat wire E (mm) | total thickness D + E (mm) | cracks |
|---|---|---|---|---|---|---|
| Inventive Example 21 | 2.1 | 1.3 | 0.1 mm × 3 | 0.015 | 0.315 | no |
| Inventive Example 22 | 2.1 | 1 | 0.05 mm × 3 | 0.015 | 0.165 | no |
| Inventive Example 23 | 2.1 | 1 | 0.05 mm × 3 | 0.018 | 0.168 | no |
| Inventive Example 24 | 1.3 | 1 | 0.1 mm × 3 | 0.025 | 0.325 | no |
| Inventive Example 25 | 1.3 | 1 | 0.1 mm × 3 | 0.05 | 0.35 | no |
| Comparative Example 26 | 2.1 | 1 | 0.15 mm × 3 | 0.022 | 0.472 | yes |
| Comparative Example 27 | 1 | 1 | 0.05 mm × 8 | 0.04 | 0.44 | yes |
| Reference Example 28 | 2.1 | 1.8 | 0.05 mm × 8 | 0.04 | 0.44 | no |

The vacuum press (pre-press) process using a vacuum bag was performed for bonding purpose on each of the laminated assemblies of Inventive Examples 21 to 15, Comparative Examples 26 and 27, and Reference Example 28. In each instance of the vacuum press process, the laminated assembly listed in Table 2 was placed in a vacuum bag which was then evacuated to a pressure of −0.96 MPa. Eight samples of each of Inventive Examples 21 to 15, Comparative Examples 26 and 27, and Reference Example 28 were subjected to the vacuum press process, and the number of samples that produced cracks in at least one of the first and second glass sheets 73 and 74 was counted. Examples which developed cracks are indicated by "yes," and those which did not are indicated by "no."

No cracks were observed in Inventive Examples 21 to 25 in which the second glass sheet 74 had a thickness of 1.0 mm to 1.6 mm, and each of the connecting portions of the electric heat wires 110, the first bus bars 111 and the second bus bars 112 had a thickness equal to 0.4 mm or less. On the other hand, cracks were observed in Comparative Examples 26 and 27 in which each of the connecting portions of the electric heat wires 110, the first bus bars 111 and the second bus bars 112 had a thickness greater than 0.4 mm. As for Reference Example 28, because the first and second glass sheets 73 and 74 both had a thickness of 1.8 mm, no cracks were observed even though each of the connecting portions of the electric heat wires 110, the first bus bars 111 and the second bus bars 112 had a thickness greater than 0.4 mm.

The present invention has been described in terms of specific embodiments thereof, but is not limited by the illustrated embodiments, and can be modified without departing from the spirit of the present invention. For instance, the device may consist of an organic or inorganic EL sheet, an LCD film, an LED array sheet and solar cell modules, instead of the organic EL panel 2. In such instances, the second intermediate film 7 may be formed with an opening 25 such that the thickness of the device may be accommodated. The first glass sheet 3, the second glass sheet 4 and the third intermediate film 8 may have any desired visible light transmissivities, ultraviolet light transmissivities and tints. For instance, the third intermediate film 8 may be darkened such that the visible light transmissivity is 10% or less so that the organic EL panel 2 and the side of the first glass sheet 3 may not be visible from outside.

GLOSSARY 1, 30, 40, 70, 100 laminated glass assembly
2 organic EL panel (device)
3 first glass sheet
4 second glass sheet
5 wiring
6 first intermediate film
7 second intermediate film
8 third intermediate film
13 terminal member
14 terminal
18 first wiring member
19 second wiring member
23 first connecting portion
24 second connecting portion
25 opening
31 fourth intermediate film
32 opening
50, 72 variable light transmission sheet (device)
73 first glass sheet
74 second glass sheet
75 flexible wire harness
76 first intermediate film
77 second intermediate film
78 third intermediate film
83 terminal member
85 solder
100 laminated glass assembly
101 defogging device (device)
103 first glass sheet
104 second glass sheet
105 lead wire
106 intermediate film
110 electric heat wire
111 first bus bar (first electroconductive member)
112 second bus bar (first electroconductive member)
120 notch
121 support surface
125 thin strip
126 thin strip
131 terminal member
132 solder
133 seal member

The invention claimed is:

1. A laminated glass assembly, comprising:
a pair of glass sheets;
an intermediate film interposed between the two glass sheets;
an electric heat wire extending along the intermediate film to emit heat when an electric current is supplied thereto; and
a bus bar layered and connected to the electric heat wire in a thickness-wise direction of the glass sheets between the two glass sheets to supply electric power to the electric heat wire;
wherein the two glass sheets are each made of soda-lime glass, and at least one of the two glass sheets has a thickness of 1.0 mm to 1.6 mm;
the intermediate film has a thickness of 0.3 mm to 2.0 mm; and
at a connecting portion between the electric heat wire and the bus bar, a total thickness of the electric heat wire and the bus bar is 0.16 mm to 0.40 mm.

2. The laminated glass assembly according to claim 1, wherein one of the glass sheets and the intermediate film are provided with a cutout on an edge portion thereof extending through a thickness thereof so that the other of the glass sheets defines a support surface exposed in the cutout, and the laminated glass assembly further comprises an electro-conductive member having an end connected to the bus bar and another end configured to receive a supply of electric power from an external source.

3. The laminated glass assembly according to claim 1, further comprising an additional bus bar, and wherein the two bus bars extend with one along each of a pair of opposing sides of the laminated glass assembly, and the electric heat wire extends between the two bus bars so as to connect the two bus bars to each other.

4. The laminated glass assembly according to claim 1, wherein the bus bar is formed by laminating a pair of thin strips, each strip including a copper main body and tin plating and having a thickness of 0.05 mm to 0.10 mm and a width of 5 mm to 20 mm.

5. A laminated glass assembly, comprising:
a first and a second glass sheet;
a first, a second and a third intermediate film interposed between the first and second intermediate films, in that order from the side of the first glass sheet;
a device interposed between the first and second intermediate films and provided with a terminal member; and
a first wiring member consisting of a metallic thin strip connected to the terminal member in a thickness-wise direction via a first solder and interposed between the first and second intermediate films;
wherein the first and second glass sheets are each made of soda-lime glass, and at least one of the two glass sheets has a thickness of 1.0 mm to 1.6 mm;
at a connecting portion of the terminal member, the first solder and the first wiring member, the first wiring member has a thickness of 0.05 mm to 0.10 mm and a width of 3 mm to 15 mm, and the first solder has a thickness of 0.01 mm to 0.20 mm; and
at the connecting portion, a total thickness of the terminal member, the first solder and the first wiring member is 0.16 mm to 0.40 mm.

6. The laminated glass assembly according to claim 5, wherein, at the connecting portion of the terminal member, the first solder and the first wiring member, a ratio of a total thickness of the terminal member, the first solder and the first wiring member to the width of the first wiring member is 6.6% or less.

7. The laminated glass assembly according to claim 5, wherein the first wiring member comprises a plurality of metallic thin strips laminated one over another in an offset relationship such that one of the metallic thin strips protrudes from an end portion of the first wiring member, and the first solder is deposited on a protruding end of the one metallic thin strip.

8. The laminated glass assembly according to claim 5, further comprising a second wiring member consisting of a metallic thin strip connected to an end of the first wiring member opposite from the end on which the first solder is deposited, via a second solder; wherein, at a connecting portion of the first wiring member, the second solder and the second wiring member, the first wiring member has a thickness of 0.05 mm to 0.10 mm and a width of 3 mm to 15 mm, the second solder has a thickness of 0.01 mm to 0.20 mm, and a total thickness of the first wiring member, the second solder and the second wiring member is 0.16 mm to 0.40 mm.

9. The laminated glass assembly according to claim 8, wherein, at the connecting portion of the first wiring member, the second solder and the second wiring member, a ratio of a total thickness of the first wiring member, the second solder and the second wiring member to the width of the second wiring member is 6.6% or less.

10. The laminated glass assembly according to claim 5, wherein the terminal member includes a thin strip projecting from a side edge of the device.

11. The laminated glass assembly according to claim 10, wherein the second intermediate film is provided with an opening passed through a thickness thereof and having a shape corresponding to that of the device such that the device is received in the opening.

12. The laminated glass assembly according to claim 11, wherein the second intermediate film is provided with a controlled visible light transmissivity so that the terminal member and the wiring members are invisible from the side of the second glass sheet.

13. The laminated glass assembly according to claim 5, wherein the first intermediate film is provided with a controlled visible light transmissivity so that the device, the terminal member and the wiring members are invisible from the side of the first glass sheet.

14. The laminated glass assembly according to claim 5, wherein the first, second and third intermediate films each have a thickness of 0.3 mm to 1.0 mm.

15. The laminated glass assembly according to claim 5, wherein the first, second and third intermediate films each contain at least a member of a group consisting of polyvinyl acetal resin, ethylene-vinyl acetate resin, polyvinyl butyral resin and polyurethane resin.

* * * * *